United States Patent
Nease et al.

(10) Patent No.: US 7,671,450 B2
(45) Date of Patent: Mar. 2, 2010

(54) INTEGRATED CIRCUIT PACKAGE FOR HIGH-SPEED SIGNALS

(75) Inventors: Ellis E. Nease, Kutztown, PA (US); Ashley Rebelo, Allentown, PA (US); Christopher J. Wittensoldner, Alburtis, PA (US)

(73) Assignee: Agere Systems Inc., Allentown, PA (US)

( * ) Notice: Subject to any disclaimer, the term of this patent is extended or adjusted under 35 U.S.C. 154(b) by 7 days.

(21) Appl. No.: 12/060,387

(22) Filed: Apr. 1, 2008

(65) Prior Publication Data

US 2009/0152689 A1    Jun. 18, 2009

Related U.S. Application Data

(60) Provisional application No. 61/014,182, filed on Dec. 17, 2007.

(51) Int. Cl.
*H01L 23/50* (2006.01)
(52) U.S. Cl. .................. 257/664; 257/E23.01; 333/247
(58) Field of Classification Search ................ 257/664, 257/734–786; 333/246–248
See application file for complete search history.

(56) References Cited

U.S. PATENT DOCUMENTS

| 6,768,206 | B2 | 7/2004 | Hosomi |
| 7,105,926 | B2 | 9/2006 | Ramakrishnan |
| 2009/0108416 | A1* | 4/2009 | Fjelstad et al. .............. 257/664 |

* cited by examiner

*Primary Examiner*—Victor A Mandala
*Assistant Examiner*—Whitney Moore

(57) ABSTRACT

An integrated circuit package having a multi-segment transmission line transformer for impedance matching a packaged integrated circuit, such as a driver or receiver, to a printed circuit board (PCB) transmission line to which the packaged chip is attached by, for example, solder balls. In one exemplary embodiment, a three-segment transmission line transformer provides improved broadband performance with the advantage of having a middle segment with a flexible length for easier routing. The length of each end segment of the three-segment transformer is adjusted to provide at least partial cancellation of reflections between the PCB and the transformer, and between the transformer and a circuit on the integrated circuit, respectively. Further, the inductive reactance of the solder balls and via wiring may be cancelled out by the transformed chip impedance to provide a non-inductive termination to the PCB transmission line at approximately one-half the highest data rate of the channel.

15 Claims, 3 Drawing Sheets

30

40

INTEGRATED CIRCUIT PACKAGE FOR HIGH-SPEED SIGNALS

CLAIM OF PRIORITY

This application claims priority to U.S. provisional application entitled "Improved Integrated Circuit Package for High-Speed Signals," Ser. No. 61/014,182 filed 17 Dec. 2007, the teachings of which are incorporated herein by reference.

TECHNICAL FIELD

The present invention relates to semiconductor packaging and, more specifically, to a high-speed data channels within a semiconductor package or the like.

BACKGROUND

One of the most demanding applications of high-speed data communications is by an on-chip serializer/deserializer (SERDES) used for serial data communication between integrated circuits (chips) on, for example, a circuit board. Typically, a SERDES on one chip communicates with a SERDES on another chip using one or more high-speed serial input/output (HSIO) channels to communicate at data rates in the multi-Gb/s range. Because the chips communicating via HSIO channels are usually individually "packaged" (e.g., in a plastic or ceramic encapsulate having conductors therein used to couple signals and power between the chip and external circuitry) and the packaged chips are in turn attached to a circuit board via solder balls or other means, broadband signal integrity at multi-Gb/s speeds may be compromised due to imperfections and impedance mismatches within the package.

One measure used to evaluate broadband signal performance for an HSIO channel within a package is the signal return loss (the ratio of incident signal power to reflected signal power as measured at the solder balls on the package, the reflected signal coming from discontinuities in the internal signal conductors within the package and from impedance mismatches), measured where the package couples to the circuit board (e.g., at the solder balls). The higher the return loss, the poorer the quality (e.g., a smaller eye opening) of the broadband digital signals passing through the package. Excessive signal return loss in at least some existing chip package designs indicates poor HSIO channel performance for those packages. Thus, there is a desire for one or more chip package designs that provides satisfactory HSIO channel performance at multi-gigabit data rates.

SUMMARY

In one embodiment, the present invention is an integrated circuit package having a chip with a circuit thereon, a multi-segment transmission line transformer having a first port and a second port, the first port coupled the circuit, and a via stack adapted to electrically couple the second port to a printed circuit board.

BRIEF DESCRIPTION OF THE DRAWINGS

The aspects, features, and advantages of the present invention will become more fully apparent from the following detailed description, the appended claims, and the accompanying drawings in which like reference numerals identify similar or identical elements. It is understood that the accompanying drawings are illustrative and are not drawn to scale.

DETAILED DESCRIPTION

For purposes here, signals and corresponding nodes, ports, inputs, or outputs may be referred to by the same name and are interchangeable.

Figure 1:
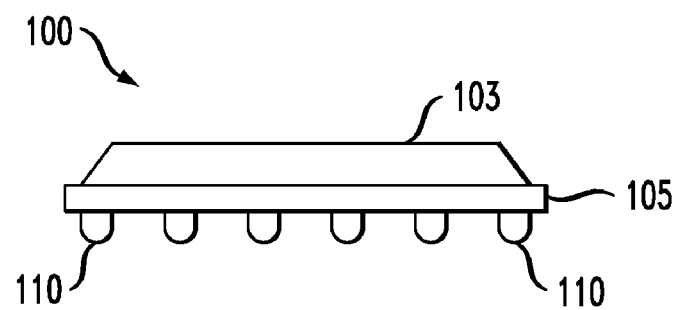
FIG. 1 is an exemplary solder-bump integrated circuit package according to one embodiment of the invention.

An exemplary embodiment of the invention is shown in the figures. FIG. 1 shows an exemplary solder-bump package 100 for providing environmental protection and electrical interconnections between an integrated circuit or chip (not shown) and external circuitry (not shown). The package 100 has an exemplary conductive cover 103 on a substrate 105. The conductive cover 103 (e.g., nickel-plated copper or nickel-plated steel) provides the environmental protection for the chip (not shown) attached to the substrate 105. The substrate 105 contains wiring to enable connections between solder balls 110 and the chip. The wiring in substrate 105 and the balls 110 are illustrated in more detail in FIG. 2.

Figure 2:
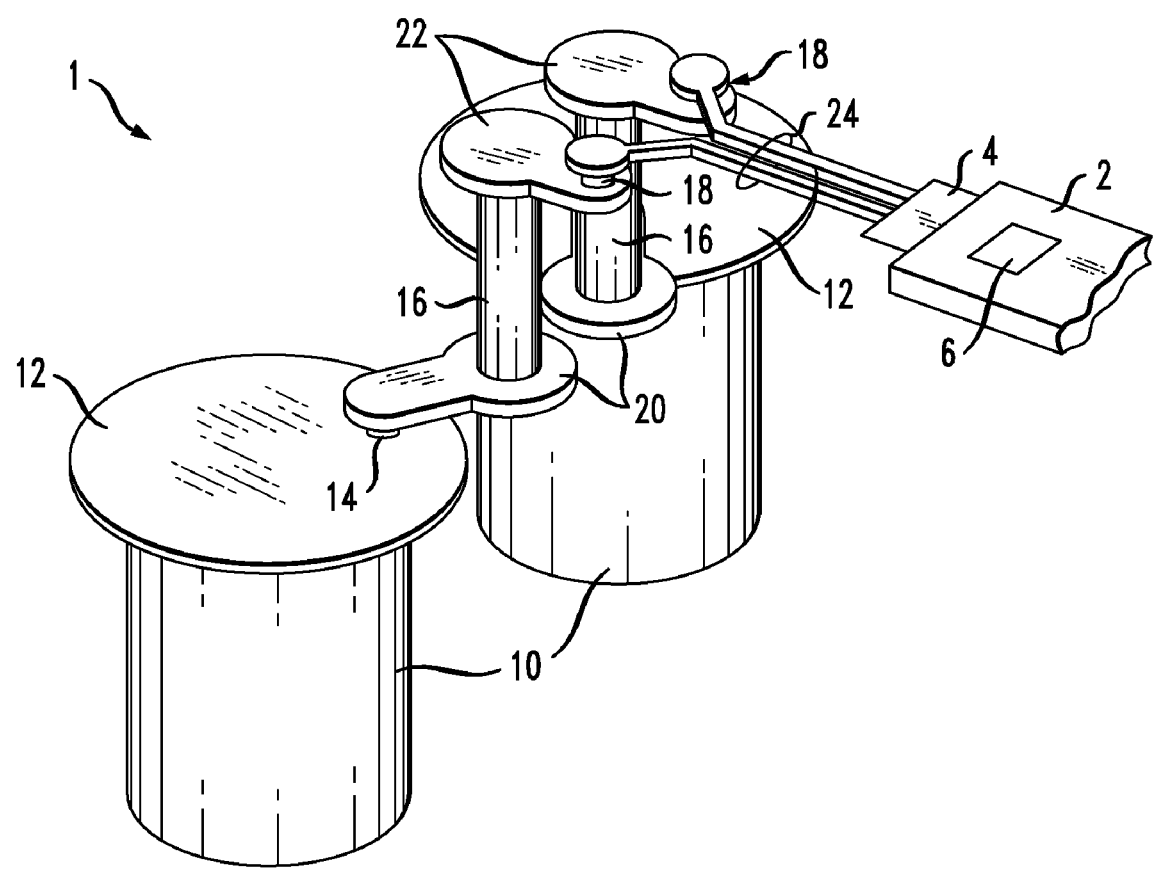
FIG. 2 is a simplified three-dimensional drawing of a chip, a transmission line transformer, wiring traces, and vias for a pair of conductors of a balanced transmission line in an exemplary solder-bump integrated circuit package as shown in FIG. 1 according to another exemplary embodiment of the present invention.
Figure 5:
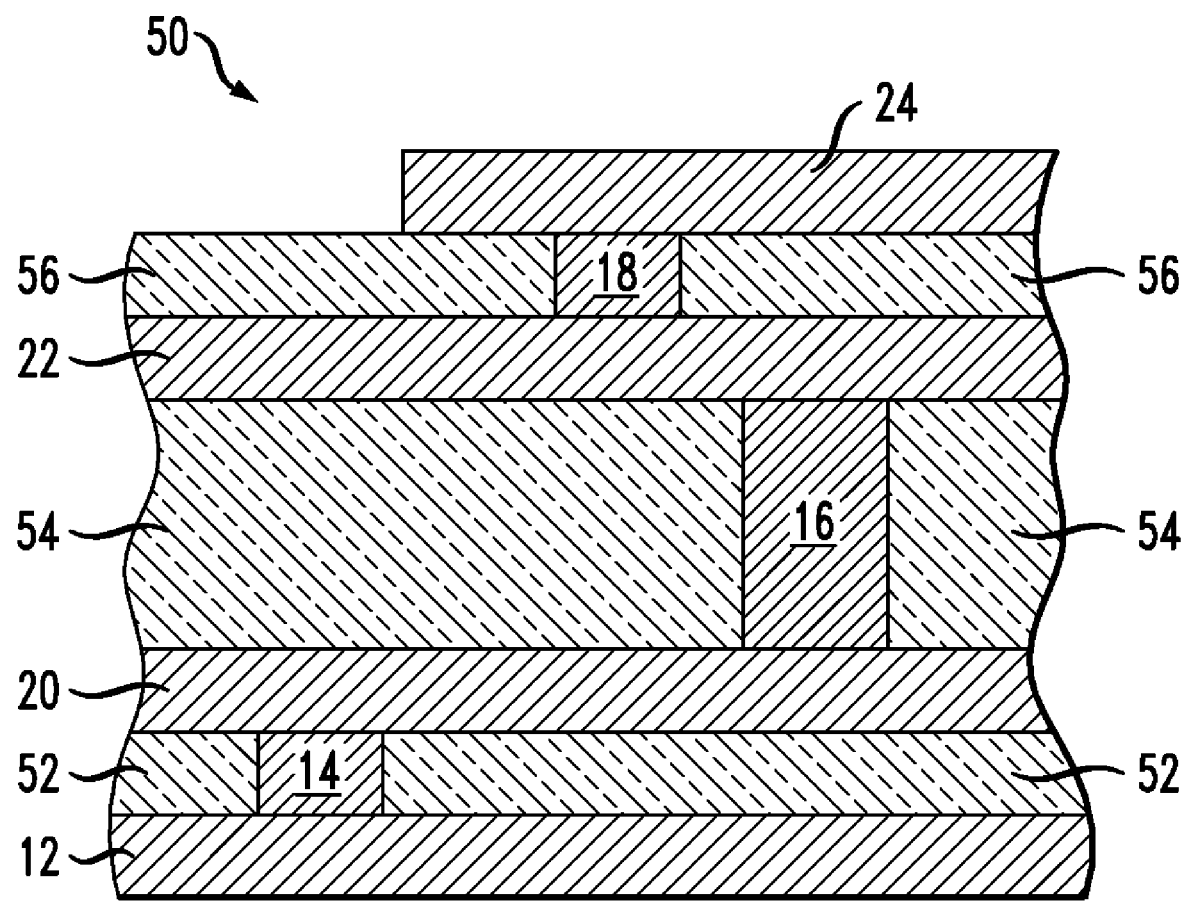
FIG. 5 is a simplified cross-section view of a portion of a multilayer substrate including the wiring traces and vias shown in FIG. 2.

FIG. 2 illustrates a via stack 1 in the exemplary solder-bump integrated circuit package 100 of FIG. 1, the via stack 1 comprising a pair of conductive paths forming a balanced transmission line with multiple segments. In this example and in a typical solder-bump integrated circuit package, bond pads (not shown) on a semiconductor integrated circuit (chip) 2 are bump-bonded to conductors (wiring traces) on a multi-layer non-conductive substrate (for clarity, the multilayer substrate is not shown here but is shown in FIG. 5, discussed below, and corresponds to the substrate 105 in FIG. 1; the substrate typically formed of a widely known glass-epoxy compound, e.g. FR-4 or BT (bismaleimide triazine)). In a typical application, the non-conductive substrate and the conductors therein are electrically and mechanically coupled to an underlying printed circuit board (PCB, not shown) with solder balls (also referred to as ball bonds or solder ball bonds) 10 that couple conductors (e.g. 12) on the bottom of the substrate to conductors (not shown) on the PCB. It is understood that a typical integrated circuit package may contain hundreds of conductive paths, each path having a solder ball, pads, conductors, and vias.

Figure 3:
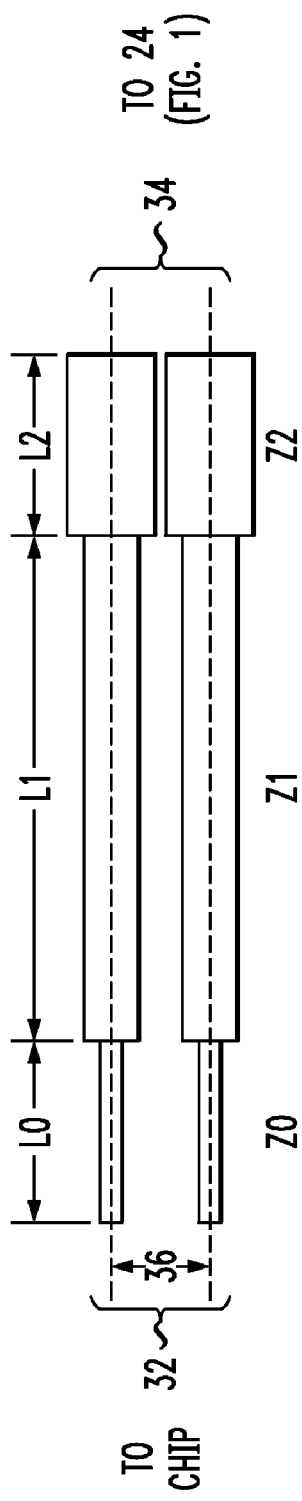
FIG. 3 is a simplified diagram of one embodiment of a transmission line transformer formed on the integrated circuit package substrate of FIG. 2.
Figure 4:
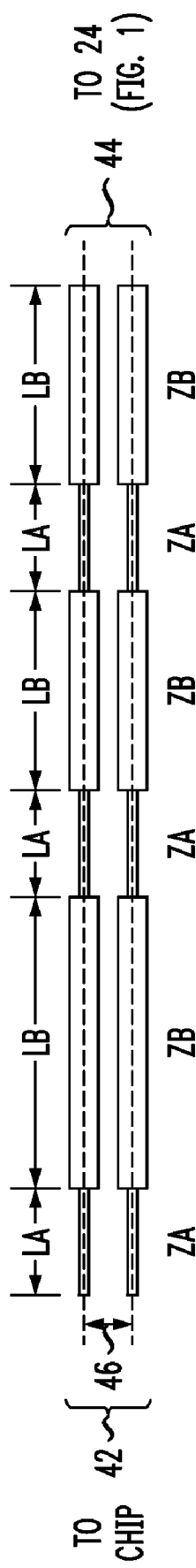
FIG. 4 is a simplified diagram of another embodiment of a transmission line transformer formed on the integrated circuit package substrate of FIG. 2.

The two conductive paths shown in FIG. 2 form a balanced transmission line and carry differential (complementary or balanced) digital signals although non-differential signals may also be carried. To simplify the drawing in FIG. 2, a portion of the solder-bump integrated circuit package 100 (FIG. 1) is shown having two conductive paths within and on the multilayer substrate (not shown but supporting the two conductive paths) and the chip 2. As stated above, the solder balls 10 electrically and mechanically attach the contact pad conductors 12 of the package 100 to PCB conductors (not shown). A transmission line transformer 4 impedance transforms and couples signals to/from circuitry 6 (e.g., a driver or receiver) on chip 2, through the via stack 1 to solder balls 10. As shown here, the transformer 4 underlies the chip 2 to shorten the distance between the transformer 4 and the circuitry 6 since, in this embodiment, the chip 2 is bump-bonded to conductors in the transformer 4. However, it is understood that a suitable transmission line may be used to couple the transformer 4 to circuitry 6 on chip 2 without having the transformer 4 underlie the chip 2, such as by wire bonds. Exemplary embodiments of the transformer 4 are shown in FIGS. 3 and 4 and discussed in detail below.

The contact pad conductors 12, on a major surface of the substrate, are coupled to via pairs 14 (one of which is hidden and the other one partially hidden). Via pair 14 is coupled to via pair 16 by conductive pair 20, and via pair 16 is in turn coupled to via pair 18 (one of which is hidden and the other one partially hidden) by conductor pair 22. Via pair 18 connects to conductors 24 which, in turn, couple to the chip 2 through the transformer 4. As illustrated, the via pairs 14-18 are formed in one or more layers (not shown) of the substrate to interconnect conductors (e.g., 12, 20-24) on or between the substrate layers. For example, via pair 14 interconnects contact pad conductors 12 to conductor pairs 20, the pad conductors 12 being disposed on an exposed surface of the substrate, and the conductor pair 20 disposed between two layers of the multilayer substrate. By using the multiple via pairs 14-18 and conductors 20, 22 and 24, the pitch (conductor center-to-center spacing) of the solder balls 10 (typically about 1 mm) are stepped down to the pitch of the conductors 24 (typically about 100 microns) that couples through transformer 4 to the chip 2 mounted on the substrate, typically on a surface of the substrate opposite from contact pad conductors 12. For illustrative purposes, conductors 24 are shown separate from the transformer 4, it is understood that conductors 24 may be part of the transformer 4. As will be explained in more detail below, the inductive reactance of the via stack 1, along with the capacitive reactance of circuitry 6, is taken into account in the design of the transformer 4 to provide a desired non-reactive termination resistance (e.g. 100 ohms) at the balls 10 at a particular frequency, thereby improving the quality of data signals at the balls 10 (e.g., as evidenced by wider, more distinct eye openings in the data signals) and the concomitant increased reliability of communication over the HSIO channel. It is understood that the invention is not restricted to using multilayer substrate or multiple pairs of vias; a single layer substrate may be used with only one pair of vias 14 or multiple via pairs in the single layer substrate, as appropriate.

As discussed above, because the impedance presented by the PCB conductors where they are attached to balls 10 may be different from the impedance of the circuit 6 on the chip 2, the return-loss of the packaged chip is improved when the impedance present where the conductors 24 meet via pair 18 is approximately matched to the impedance of the circuit 6. This may be accomplished with a stepped (segmented) transmission line transformer structure 4. In one embodiment, the stepped transformer structure has two transmission line segments, where each segment has a characteristic impedance that allows for the matching of the impedance of the structures (as presented at conductors 24 or from the circuit 6) coupled to the ends (ports) of the transformer 4. For example, a simulation may be performed to determine the impedance "looking into" to the structures coupled to either end of the transformer 4. These impedances are used to design the transformer 4 to provide the appropriate impedance transformation. The lengths of the segments may be adjusted to cancel any signal reflections within the package, as will be explained below. However, while a two-segment transformer might pro-vide the desired impedance transformation, the transformer might not have the physical length needed to couple the chip 2 to the via stack 1. The two-segment transformer may be serially replicated to achieve the desired physical length, as will be discussed in more detail below in connection with FIG. 4.

In FIG. 5, a portion of a multilayer substrate 50 is shown including the wiring traces and vias illustrated in FIG. 2. Features or elements in FIG. 5 numbered with the same reference numerals as those in FIG. 2 are the same as the features or elements in FIG. 2, although only one of a pair of a particular feature is shown. In this example, the substrate 50 comprises conductors 12 and 20-24, and interposed insulative layers 52-56, typically formed from FR-4 or BT compounds. Vias 14-18 are shown interconnecting the conductors 12 and 20-24, as described above.

Another approach to overcoming the restricted physical length of the two-segment transformer, discussed above, is presented in FIG. 3. Here, a three-segment transmission line transformer structure 30 has an adjustable physical length and provides an acceptable signal return loss at high data rates in this embodiment, it is desirable, but not essential, that the end segment characteristic impedance $Z_0$ is substantially the same as the magnitude of the impedance presented at port 34, the impedance of the PCB conductors at the solder balls 10 (FIG. 2) added to the impedance of the via stack 1 (FIG. 2) at a particular frequency, discussed below. For example, if the desired load impedance is 100+j0 ohms in series with the via stack 1 impedance of 5+j20 ohms, the resulting impedance is 105+j20 ohms, and the characteristic impedance $Z_0$ is thus set to approximately 107 ohms ($|105+j20|=107$). Also in this embodiment, it is desirable, but not essential, that the end segment characteristic impedance $Z_2$ is substantially the same as the magnitude of impedance of the circuit on the chip being coupled to the transformer 30 at port 32. Further, as explained in more detail below, the end segment physical lengths (L0 and L2) may be adjusted so that the propagation delays in the end segments are matched to the respective transformer port 32-to-chip and via stack 1 propagation delays. This helps cancel reflections occurring within the chip 2 and via stack 1. The middle trace length (L1) may be of a desired length to allow routing from chip bumps to the via stack. The characteristic impedance $Z_2$ of the middle segment is between the $Z_0$ and $Z_2$ impedance and it is desirable, but not essential, that $Z_1$ is an average of the $Z_0$ and $Z_2$ impedances, although another impedance may be used, e.g., the root-mean-square of the impedances $Z_0$ and $Z_2$.

As stated above, it is desirable, but not essential, that the physical length of each end segment (L0, L2) is of a length that results in the propagation delay therein to approximately match the propagation delay through the structure coupled to that end segment. For the via stack end of the transformer 30 (port 34), the propagation delay to be matched is measured or calculated for a signal propagating through the via stack 1 (FIG. 2) into an exemplary 100 ohm balanced PCB termination at the balls 10 (FIG. 2). For the chip side of the transformer (port 32), the propagation delay to be matched is measured or calculated from the transformer port 32 to the chip circuit 6 (FIG. 2) coupled thereto. The desired end segment propagation delays are then translated into physical lengths using the segment's velocity of propagation as is well known in the art. Any middle segment (L1, Z1) mismatch reflections from either end segment are believed to be at least partially cancelled in the center of the middle segment because reflections from the mismatches are believed to be approximately opposite in phase and, as such, they tend to cancel out in the center of the trace.

The segments of the transformer 30 in this embodiment are shown having a substantially constant pitch, i.e., the center-to-center spacing 36 of each segment is the same for all segments. However, it is understood that other segment transmission line structures with a center-to-center spacing different from other segments in the transformer 30 may be used to achieve the desired segment impedance.

A three-segment transformer may be used where the end segment impedances Z0, Z2 can be made to match the typically low impedance presented by the circuit 6 on the chip 2 (FIG. 2). Unfortunately, as the data rates increase, the impedance of the circuit 6 (e.g., a driver) may decrease and a three-segment transformer may not be able to adequately match the circuit impedance depending on the range of manufacturable characteristic impedances of the end segments. If the end segment characteristic impedances cannot be made sufficiently low or high, the end segments may not sufficiently cancel reflected energy from mismatches between the transmission line segments. A repetitive multi-segment transformer 40, as shown in FIG. 4, with several reflection cancellation points may be used instead. For such a multi-segment transformer structure 40, a repeating pattern of a pair of segments is replicated as many times as needed over the entire via stack to chip-bump length. This may result in the physical length of transformer 40 being too long or too short by less than the physical length of a segment pair. In a final design, the length of all the segment pairs may be adjusted slightly to compensate for the length error. Similar to the transformer 30 shown in FIG. 3, the transformer 40 has a port 42 for coupling to the chip 2 (FIG. 2) and a port 44 for coupling to the conductors 24 of the via stack 1 (FIG. 2).

Determination of the segment lengths LA and LB is the same as that used to determine L0 and L2, respectively, as discussed above in connection with FIG. 3. Similarly, determination of the segment impedances ZA and ZB is the same as that used to determine Z0 and Z2, respectively, as discussed above in connection with FIG. 3, but the characteristic impedance of ZB may be significantly different from the magnitude of the impedance of the circuit 6 (as presented to port 42) and still provide an adequate signal return loss. Similarly, the characteristic impedance ZA may be significantly different from the magnitude of the impedance presented to the port 44.

The segments of the transformer 40 in this embodiment are shown having a substantially constant pitch, i.e., the center-to-center spacing 46 of each segment is the same for all segments. However, it is understood that other segment transmission line structures with a center-to-center spacing different from other segments in the transformer 40 may be used to achieve the desired segment impedance.

Using the repetitive multi-segment transformer 40 may cause additional insertion loss (the ratio of incident signal power to output signal power) for the package structure when compared to the transformer 30 shown in FIG. 3. This additional loss is believed to be due to the dissipation of the mismatch reflected energy through several mismatch step structures. However, this additional insertion loss may result in an improved return loss as measured at the balls 10 (FIG. 2) when compared to using no transformer 4.

Further improvement in the performance of the package may be accomplished by "tuning" the lumped element equivalent inductance of the via stack 1 to cancel remaining reactance of the impedance from the transformer at port 34, 44 at particular frequency. This enhances the eye opening of the data signal as measured at the balls 10. The particular frequency, referred to herein as the cancellation frequency, is chosen to be approximately the maximum frequency of the Nyquist bandwidth of the signals being conveyed through the via stack 1 and the transformer 4. For non-return to zero (NRZ) data, the cancellation frequency is at approximately one-half the highest data rate of the channel, e.g., for a 10 gigabit data rate, the cancellation frequency is approximately 5 GHz.

The impedance of each segment of the transformers is, in this embodiment, at least partially determined by the width of the conductors or traces making up each segment and retaining a substantially constant pitch for the conductors in the transformer since this allows for a compact transformer structure. However, it is understood that other techniques for varying the impedance for each segment may be done, such as by using equal-width segment conductors and setting the pitch of each segment. The changes in widths of the conductors for each transformer segment for the transformers 30 and 40 may be an abrupt transition or may be a smoothed (rounded) transition, as desired.

Although the present invention has been described in the context of a packaged SERDES device, those skilled in the art will understand that the present invention can be implemented in the context of other types of integrated circuit packages and other types of high-speed devices or applications.

EXAMPLES

The following approximate dimensions and segment impedances have been used to match a receiver having an approximately 42−j44 ohm impedance to a differential resistive load of approximately 100+j0 ohms presented to the balls 10. The cancellation frequency is 5 GHz for an NRZ data rate of 10 Gb/s.

| | |
|---|---|
| Z0 = 114 ohms | L0 = 0.5 mm |
| Z1 = 87 ohms | L1 = as needed |
| Z2 = 62 ohms | L2 = 1.3 mm |

The pitch of the transformer conductors is approximately 90 μm, resulting in the segments having an approximate width of 25, 45, and 65 μm, respectively. By having each of the vias 14, 16, and 18 with diameters of 50, 100, and 50 μm, respectively, lengths of 35, 400, and 35 μm, respectively, and center-to-center spacing of 290, 290, and 650 μm, respectively, the approximate lumped series impedance of the via stack 1 is 6+j42 ohms. All of the above impedances in this example are differential (balanced) impedances.

For the multi-segment transformer shown in FIG. 4, an exemplary on-chip driver having an approximately 12−j12 ohm impedance is to be matched to resistive load of approximately 100+j0 ohms presented to the balls 10. The cancellation frequency is 5 GHz:

| | |
|---|---|
| ZA = 108 ohms | LA = 0.28 mm |
| ZB = 34 ohms | LB = 0.80 mm |

The pitch of the transformer conductors is approximately 90 μm, resulting in the segments having an approximate width of 30 and 65 μm, respectively. By having each of the vias 14, 16, and 18 with diameters of 50, 100, and 50 μm, respectively, lengths of 35, 400, and 35 μm, respectively, and center-to-center spacing of 570, 570, and 570 μm, respectively, the approximate lumped series impedance of the via stack 1 is 2+j34 ohms. While the magnitude of the impedance of the driver is 17 ohms (|12−j12|=17) and different from the ZB impedance of 34 ohms, the return loss using this transformer design was found to be satisfactory when the segment pairs LA, LB was repeated between eight and ten times as required. All of the above impedances in this example are differential (balanced) impedances.

For purposes of this description and unless explicitly stated otherwise, each numerical value and range should be interpreted as being approximate as if the word "about" or "approximately" preceded the value of the value or range. Further, reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the terms "implementation" and "example."

Also for purposes of this description, the terms "couple," "coupling," "coupled," "connect," "connecting," or "connected," refer to any manner known in the art or later developed in which a signal is allowed to be transferred between two or more elements and the interposition of one or more additional elements is contemplated, although not required. Conversely, the terms "directly coupled," "directly connected," etc., imply the absence of such additional elements.

It is understood that various changes in the details, materials, and arrangements of the parts which have been described and illustrated in order to explain the nature of this invention may be made by those skilled in the art without departing from the scope of the invention as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The invention claimed is:

1. An integrated circuit package comprising:
a chip having a circuit thereon;
a multi-segment transmission line transformer having a first port and a second port, the first port coupled the circuit; and
a via stack adapted to electrically couple the second port to a printed circuit board;
wherein the circuit is adapted to provide an impedance (Zc) and the via stack has an impedance (Zv), and wherein the transformer is adapted to convert the impedance of the circuit to an impedance that combined with the impedance of the via stack has an impedance approximately that of a desired impedance (Zt);
wherein the transmission line transformer comprises:
a middle segment;
a first end segment coupled between the first transformer port and the middle segment; and
a second end segment coupled between the second transformer port and the middle segment; and
wherein the first end segment has a characteristic impedance of approximately |Zt+Zv|, the second end segment has a characteristic impedance of approximately |Zc|, and the middle segment has a characteristic impedance between the characteristic impedances of the first and second end segments.

2. The integrated circuit package of claim 1, wherein the first end, middle, and second end segments have center-to-center spacings that are substantially the same.

3. An integrated circuit package comprising:
a chip having a circuit thereon;
a multi-segment transmission line transformer having a first port and a second port, the first port coupled the circuit; and
a via stack adapted to electrically couple the second port to a printed circuit board;
wherein the transmission line transformer comprises:
a middle segment;
a first end segment coupled between the first transformer port and the middle segment; and
a second end segment coupled between the second transformer port and the middle segment;
wherein between the first transformer port and the circuit is a first propagation delay, wherein the via stack has a second propagation delay, and wherein the first end segment has a propagation delay approximately equal to the first propagation delay, and the second end segment has a propagation delay approximately equal to the second propagation delay.

4. The integrated circuit package of claim 3, wherein, at a compensation frequency, the via stack has a reactance that substantially cancels reactance at the second transformer port, and wherein signals to be conveyed through the via stack have a maximum data rate, and the compensation frequency is approximately one-half the maximum data rate.

5. An integrated circuit package comprising:
a chip having a circuit thereon;
a multi-segment transmission line transformer having a first port and a second port, the first port coupled the circuit; and
a via stack adapted to electrically couple the second port to a printed circuit board;
wherein the transmission line transformer comprises one or more segment pairs, each segment pair comprising:
a first segment coupled to the first transformer port; and
a second segment coupled between the first segment and the second transformer port;
wherein between the first transformer port and the circuit is a first propagation delay, wherein the via stack has a second propagation delay, and wherein the first segment has a propagation delay approximately equal to the first propagation delay, and the second segment has a propagation delay approximately equal to the second propagation delay.

6. The integrated circuit package of claim 5, wherein, at a compensation frequency, the via stack has a reactance that substantially cancels reactance at the second transformer port, and wherein signals to be conveyed through the via stack have a maximum data rate, and the compensation frequency is approximately one-half the maximum data rate.

7. An integrated circuit package comprising:
a chip having a circuit thereon;
a multi-segment transmission line transformer having a first port and a second port, the first port coupled the circuit; and
a via stack adapted to electrically couple the second port to a printed circuit board;
wherein the circuit is adapted to provide an impedance (Zc) and the via stack has an impedance (Zv), and wherein the transformer is adapted to convert the impedance of the circuit to an impedance that combined with the impedance of the via stack has an impedance approximately that of a desired impedance (Zt);

wherein the transmission line transformer comprises:
a middle segment;
a first end segment coupled between the first transformer port and the middle segment; and
a second end segment coupled between the second transformer port and the middle segment; and
wherein between the first transformer port and the circuit is a first propagation delay, wherein the via stack has a second propagation delay, and wherein the first end segment has a propagation delay approximately equal to the first propagation delay, and the second end segment has a propagation delay approximately equal to the second propagation delay.

8. An integrated circuit package comprising:
a chip having a circuit thereon adapted to provide an impedance (Zc);
a multi-segment transmission line transformer having a first port and a second port, the first port coupled the circuit; and
a via stack having an impedance (Zv) and adapted to electrically couple the second port to a printed circuit board;
wherein the transformer is adapted to convert the impedance of the circuit to an impedance that combined with the impedance of the via stack has an impedance approximately that of a desired impedance (Zt);
wherein the transmission line transformer comprises one or more segment pairs, each segment pair comprising:
a first segment coupled to the first transformer port; and
a second segment coupled between the first segment and the second transformer port; and
wherein between the first transformer port and the circuit is a first propagation delay, wherein the via stack has a second propagation delay, and wherein the first segment has a propagation delay approximately equal to the first propagation delay, and the second segment has a propagation delay approximately equal to the second propagation delay.

9. An integrated circuit package comprising:
a chip having a circuit thereon adapted to provide an impedance (Zc);
a multi-segment transmission line transformer having a first port and a second port, the first port coupled the circuit; and
a via stack having an impedance (Zv) and adapted to electrically couple the second port to a printed circuit board;
wherein the transformer is adapted to convert the impedance of the circuit to an impedance that combined with the impedance of the via stack has an impedance approximately that of a desired impedance (Zt);
wherein the transmission line transformer comprises one or more segment pairs, each segment pair comprising:
a first segment coupled to the first transformer port; and
a second segment coupled between the first segment and the second transformer port; and
wherein the first segment has a characteristic impedance of approximately |Zt+Zv|, and the second segment has a characteristic impedance of approximately |Zc|.

10. The integrated circuit package of claim 9, wherein the first and second segments have center-to-center spacings that are substantially the same.

11. An integrated circuit package comprising:
a chip having a circuit thereon;
a multi-segment transmission line transformer having a first port and a second port, the first port coupled the circuit; and
a via stack adapted to electrically couple the second port to a printed circuit board;
wherein between the first transformer port and the circuit is a first propagation delay, wherein the via stack has a second propagation delay, and wherein one segment of the multi-segment transformer has a propagation delay approximately equal to the first propagation delay, and another segment of the multi-segment transformer has a propagation delay approximately equal to the second propagation delay.

12. An integrated circuit package comprising:
a chip having a circuit thereon;
a multi-segment transmission line transformer having a first port and a second port, the first port coupled the circuit; and
a via stack adapted to electrically couple the second port to a printed circuit board;
wherein, at a compensation frequency, the via stack has a reactance that substantially cancels reactance at the second transformer port, and wherein signals to be conveyed through the via stack have a Nyquist bandwidth with a maximum frequency, the compensation frequency being approximately the maximum frequency.

13. The integrated circuit package of claim 12, wherein the signals to be conveyed are non-return-to-zero signals having a maximum data rate, and the compensation frequency is approximately one-half the maximum data rate.

14. An integrated circuit package comprising:
a chip having a circuit thereon;
a multi-segment transmission line transformer having a first port and a second port, the first port coupled the circuit; and
a via stack adapted to electrically couple the second port to a printed circuit board;
wherein the via stack comprises:
a substrate;
a plurality of solder balls on a surface of the substrate; and
a pair of vias in the substrate;
wherein the pair of vias couples at least two of the plurality of solder balls to the second transformer port and wherein the substrate is a multilayer substrate comprising glass-epoxy.

15. The integrated circuit package of claim 14, wherein the chip is bonded to a surface of the substrate opposite to the solder balls.

* * * * *